(12) United States Patent
Liaw

(10) Patent No.: US 11,121,234 B2
(45) Date of Patent: Sep. 14, 2021

(54) STACKED GATE SPACERS

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/392,769

(22) Filed: Apr. 24, 2019

(65) Prior Publication Data

US 2020/0343359 A1    Oct. 29, 2020

(51) Int. Cl.

| | |
|---|---|
| *H01L 29/66* | (2006.01) |
| *H01L 29/06* | (2006.01) |
| *H01L 29/78* | (2006.01) |
| *H01L 21/8238* | (2006.01) |
| *H01L 27/092* | (2006.01) |

(52) U.S. Cl.
CPC .. *H01L 29/6656* (2013.01); *H01L 21/823821* (2013.01); *H01L 21/823828* (2013.01); *H01L 21/823864* (2013.01); *H01L 21/823871* (2013.01); *H01L 27/0928* (2013.01); *H01L 29/0649* (2013.01); *H01L 29/6653* (2013.01); *H01L 29/66545* (2013.01); *H01L 29/66795* (2013.01); *H01L 29/785* (2013.01); *H01L 2029/7858* (2013.01)

(58) Field of Classification Search
None
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 10,062,764 B1 * | 8/2018 | Wu | H01L 29/515 |
| 10,388,747 B1 * | 8/2019 | Xie | H01L 29/41775 |
| 10,522,649 B2 * | 12/2019 | Cheng | H01L 29/4991 |

(Continued)

*Primary Examiner* — Michelle Mandala
*Assistant Examiner* — Jordan M Klein
(74) *Attorney, Agent, or Firm* — Haynes and Boone, LLP

(57) ABSTRACT

The present disclosure provides a semiconductor device and a method of forming the same. In an embodiment, the semiconductor device includes a fin extending from a substrate, a gate structure over the channel region, a first spacer extending along a sidewall of the lower portion of the gate structure, and a second spacer extending along a sidewall of the upper portion of the gate structure. The fin includes a channel region and a source/drain (S/D) region adjacent to the channel region. The gate structure includes an upper portion and a lower portion. The second spacer is disposed on a top surface of the first spacer. The first spacer is formed of a first dielectric material and the second spacer is formed of a second dielectric material different from the first dielectric material.

20 Claims, 10 Drawing Sheets

(56) References Cited

U.S. PATENT DOCUMENTS

| | | | |
|---|---|---|---|
| 2014/0070285 A1* | 3/2014 | Xie | H01L 29/66545 257/288 |
| 2015/0206754 A1* | 7/2015 | Horak | H01L 29/78 257/288 |
| 2016/0111518 A1* | 4/2016 | Chang | H01L 29/6656 257/401 |
| 2016/0365426 A1* | 12/2016 | Ching | H01L 29/66795 |
| 2016/0372567 A1* | 12/2016 | Tak | H01L 29/0847 |
| 2017/0162650 A1* | 6/2017 | Cheng | H01L 29/66795 |

* cited by examiner

STACKED GATE SPACERS

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, even with the introduction of FinFETs, aggressive scaling down of IC dimensions has resulted in increased parasitic capacitance (e.g., between a FinFET gate and source/drain regions or source/drain contacts). As a result of such increased parasitic capacitance, device performance is degraded. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
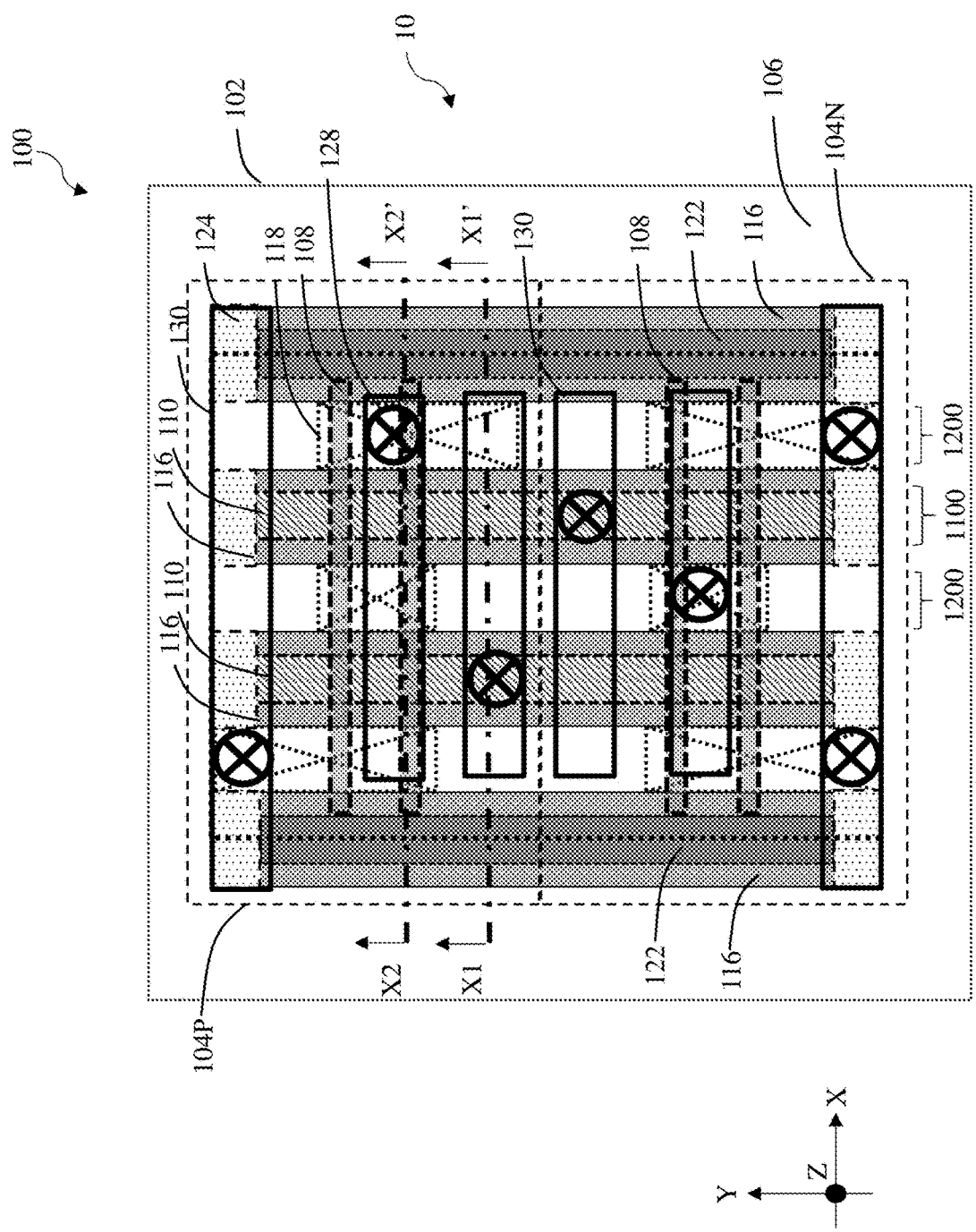
FIG. 1 is a diagrammatic top view of a FinFET device according various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

The present disclosure relates to semiconductor device structures and methods of forming the same, particularly high-performance semiconductor device structures and methods. As gate pitches shrink, conventional processes to form semiconductor devices face a dilemma between having a thick gate spacer to enlarge process error margins and reduce capacitance and having a thin gat spacer to enlarge space for source/drain features. When the gate spacer is thin, a minor misalignment may cause the source/drain contact to be in contact with the gate structure, resulting in shorting and device failure. When the thickness of the gate spacer is increased to avoid shorting between the gate structure and the source/drain contact, the thicker gate spacer leaves less room to form source/drain features that may have high dopant concentration or high strain. At the same time, depending on the device design, thick gate spacers may reduce source/drain contact landing area and thin gate spacers may reduce device reliability as source/drain recess may punch through the thin gate spacer. A semiconductor structure according embodiments of the present disclosure includes a first spacer on sidewalls of a lower portion of the gate structure and a second spacer stacked on a top surface of the first spacer. The first and second spacers may have different thicknesses, different compositions, and different dielectric constants to have one gate spacer configuration at the level corresponding to the source/drain features and another gate spacer configuration at the level corresponding to the source/drain contact.

Illustrated in FIG. 1 is a diagrammatic top view of a FinFET device 100 on a workpiece 10. The FinFET device 100 includes one or more fin-based, multi-gate field-effect transistors (FETs). While the embodiments of the present disclosure are described using the FinFET device 100 in FIG. 1 as an example, the present disclosure is not so limited and may be applicable to other type of FETs that include semiconductor features other than the fins shown in figures of the present disclosure. FIGS. 2a, 3a, 4a, and 5a are diagrammatic cross-sectional views of the FinFET device 100 in FIG. 1 along section X1-X1'. FIGS. 2b, 3b, 4b, and 5b are diagrammatic cross-sectional views of the FinFET device 100 in FIG. 1 along section X2-X2'.

Figure 2A:
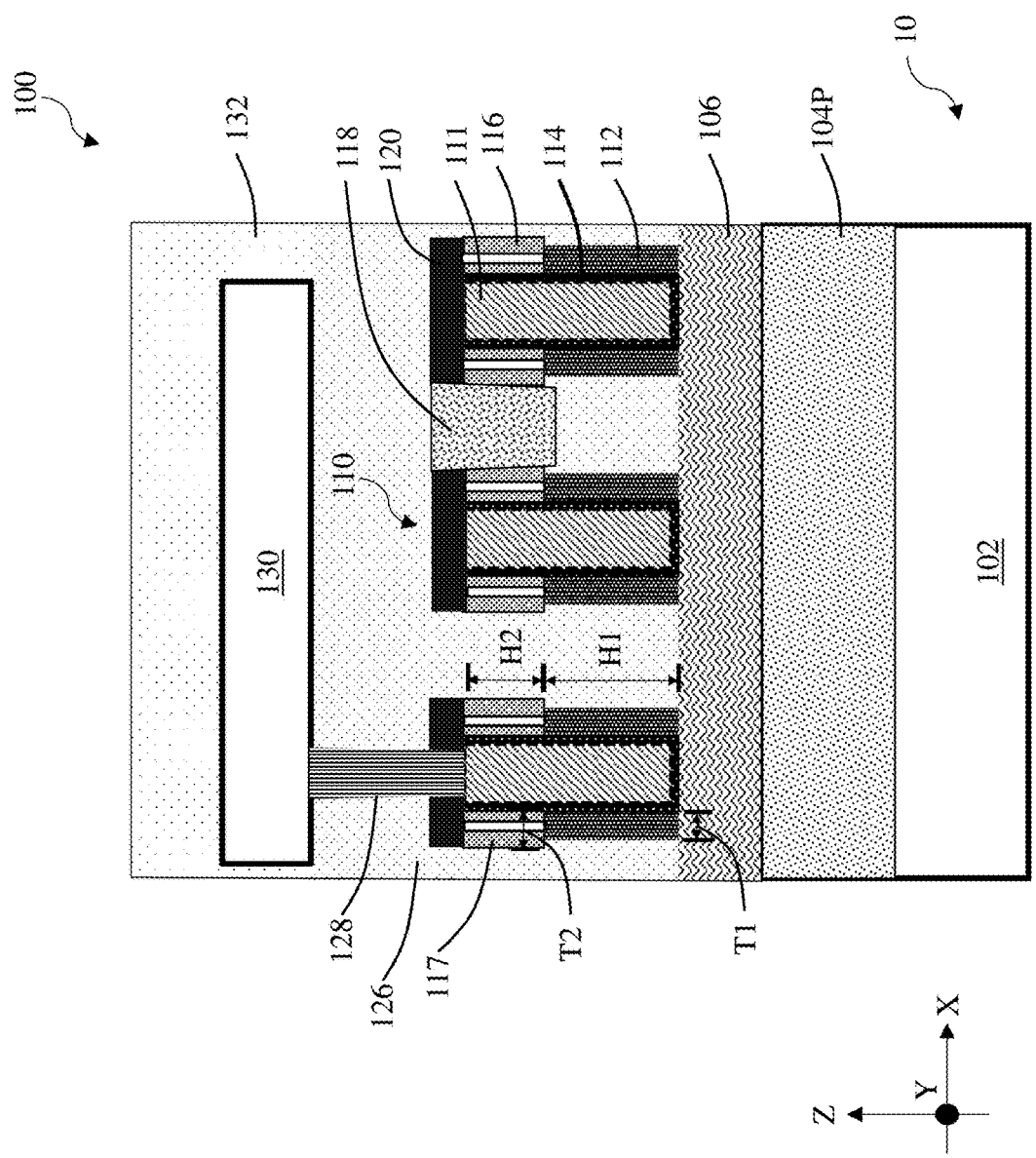
FIGS. 2a, 3a, 4a, and 5a are diagrammatic cross-sectional views of the FinFET device in FIG. 1 along section X1-X1' according to various embodiments of the present disclosure.
Figure 2B:
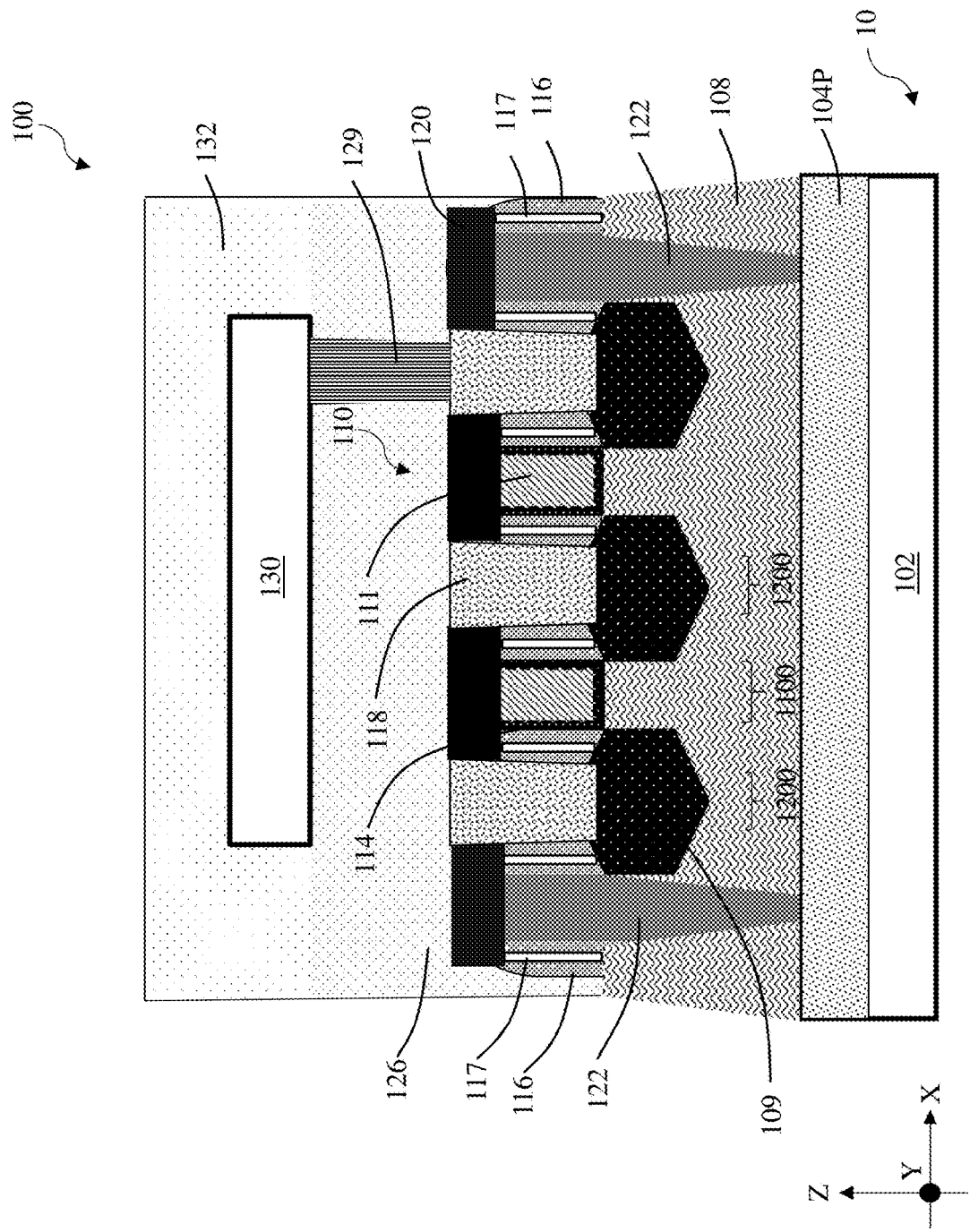
FIGS. 2b, 3b, 4b, and 5b are diagrammatic cross-sectional views of the FinFET device in FIG. 1 along section X2-X2' according to various embodiments of the present disclosure.

Referring now to FIGS. 1, 2a and 2b, the FinFET device 100 on the workpiece 10 includes a substrate 102, at least one fin (or fin element) 108 extending from the substrate 102, isolation regions 106, and a gate structure 110 disposed on and around the fin 108. The substrate 102 may be a semiconductor substrate such as a silicon substrate. The substrate 102 may include various layers, including conductive or insulating layers formed on a semiconductor substrate. The substrate 102 may include various doping configurations depending on design requirements as is known in the art. For example, the FinFET device 100 may include an n-type well 104N and a p-type well 104P. In some embodiments, the n-type well 104N may include an n-type dopant, such as arsenide and phosphorous and the p-type well 104P may include a p-type dopant, such as boron. In some implementations, one or more p-type FinFETs may be formed in the n-type well 104N and one or more N-type FinFETs may be formed in the p-type well 104P. Because both sections X1-X1' and X2-X2' pass the p-type well 104P, FIGS. 2a~5a and 2b~5b illustrate only cross-sections of the p-type well 104P.

The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include an SOI structure, and/or the substrate 102 may have other suitable enhancement features.

The fin 108, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 108 may be fabricated using suitable processes including photolithography and etch processes. The photolithography process may include forming a photoresist layer (resist) overlying the substrate 102 (e.g., on a silicon layer), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 102 while an etch process forms recesses into the substrate 102, thereby leaving an extending fin 108. The recesses may be etched using a dry etch (e.g., chemical oxide removal), a wet etch, and/or other suitable processes. Numerous other embodiments of methods to form the fins 108 on the substrate 102 may also be used.

Each of the plurality of fins 108 also include a source/drain region 1200 where a source/drain feature 109 (not shown in FIG. 1 but is shown as 109 is formed in FIGS. 2a and 2b), on, adjacent and/or surrounding the fin 108. It is noted that in a FET, such as the FinFET device 100, a channel region 1100 is sandwiched between a source region 1200 and a drain region 1200. For ease of reference and description, the source region 1200 and the drain region 1200 on different sides of a channel region 1100 is referred to generally as the source/drain region 1200 in FIG. 1. The source/drain feature 109 may be epitaxially grown over the fins 108. The channel region 1100 is disposed within the fin 108 underlying the gate structure 110 and extend along X direction in FIG. 1. From the top view in FIG. 1, the gate structure 110 extends across and over the channel region 1100 of the fin 108. In some examples, the channel region 1100 of the fin 108 includes silicon and a high-mobility material such as germanium, as well as any of the compound semiconductors or alloy semiconductors discussed above and/or combinations thereof. High-mobility materials include those materials with an electron mobility greater than silicon, which has an intrinsic electron mobility at room temperature (300 K) of around 1350 $cm^2$/V-s and a hole mobility of around 480 $cm^2$/V-s.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure.

The gate structure 110 includes a gate stack including a gate dielectric layer 114 (not shown in FIG. 1, but is shown in FIGS. 2a~2b), and a metal layer 111 (a gate electrode, not shown in FIG. 1, but is shown as FIGS. 2a~2b) formed over the gate dielectric layer 114. In some embodiments, the gate dielectric layer 114 may include an interfacial layer formed over the channel region 1100 of the fin 108 and a high-K dielectric layer over the interfacial layer. The interfacial layer of the gate dielectric layer 114 may include a dielectric material such as silicon oxide layer ($SiO_2$) or silicon oxynitride (SiON). The high-K dielectric layer of the gate dielectric layer 114 may include $HfO_2$, $TiO_2$, HfZrO, $Ta_2O_3$, $HfSiO_4$, $ZrO_2$, $ZrSiO_2$, combinations thereof, or other suitable materials. The gate dielectric layer 114 may be formed by chemical oxidation, thermal oxidation, atomic layer deposition (ALD), physical vapor deposition (PVD), chemical vapor deposition (CVD), and/or other suitable methods. The metal layer 111 may include a conductive layer such as W, TiN, TaN, WN, Re, Ir, Ru, Mo, Al, Cu, Co, Ni, combinations thereof, and/or other suitable compositions. In some embodiments, the metal layer 111 may include a first group of metal materials for n-type FinFETs and a second group of metal materials for p-type FinFETs. Thus, the FinFET device 100 may include a dual work-function metal gate configuration. For example, the first metal material (e.g., for n-type devices) may include metals having a work function substantially aligned with a work function of the substrate conduction band, or at least substantially aligned with a work function of the conduction band of the channel region 1100 of the fin 108. Similarly, for example, the second metal material (e.g., for P-type devices) may include metals having a work function substantially aligned with a work function of the substrate valence band, or at least substantially aligned with a work function of the valence band of the channel region 1100 of the fin 108. Thus, the metal layer 111 may function as a gate electrode for the FinFET device 100, including n-type FinFET devices formed over the p-type well 104P and p-type FinFET devices formed over the n-type well 104N. The metal layer 111 may be formed using PVD, CVD, electron beam (e-beam) evaporation, and/or other suitable process.

In some embodiments, a replacement gate process (or gate replacement process) may be used to form the gate structure 110. In a replacement gate process, a sacrificial gate structure or a dummy gate structure is first formed of a semiconductor material, such as polysilicon, over the channel region 1100 of the fin 108 to serve as a placeholder for the final gate structure (such as the gate structure 110) to be formed. After features around the dummy gate structure are fabricated, the dummy gate structure will be removed and replaced with the final gate structure, such as the gate structure 110 and the gate dielectric layer 114. When the replacement gate process is used, multiple gate spacers, such as the first spacer 112 and the second spacer 116 in FIGS. 2a and 2b, may be formed over the dummy gate. Gate spacers formed on the top surface of the dummy gate structure may be removed at a later stage to allow access to and removal of the dummy gate structure. In some embodiments represented in FIGS. 2a and 2b, the first spacer 112 and the second spacer 116 are formed to cover sidewalls of the dummy gate structure. After the dummy gate structure is replaced with the gate structure 110 lined with the gate dielectric layer 114, the first spacer 112 and the second spacer 116 cover sidewalls of the gate structure 110 in a similar manner and are in contact with the gate dielectric layer 114. The first and second spacers 112 and 116 may include a dielectric material such as silicon oxide, silicon nitride, silicon carbide, silicon oxynitride, silicon oxy-carbide, silicon carbonitride, silicon oxy-carbonitride, or combination thereof. In some embodiments, the second spacer 116 is deposited after the source/drain feature 109 is formed and may be disposed over a portion of the source/drain feature 109 as shown in FIG. 2b.

The FinFET device 100 may include various isolation structures to define a sub-unit of the FinFET device 100. In some embodiments shown in FIGS. 1, 2a and 2b, the FinFET device 100 includes one or more gate end dielectric 124 and one or more dielectric gate 122. In some embodiments, the gate end dielectric 124 may be formed using a gate cut process, which includes forming a gate-cut trench and filling the gate-cut trench with a dielectric material. In those embodiments, the gate end dielectric 124 may also be referred to as a gate-cut feature 124. The dielectric gate 122 functions to divide a fin 108 into two sections and may be referred to as a channel isolation feature 122. The dielectric gate 122 and the gate end dielectric 124 both are formed of dielectric materials and may define a sub-unit of the FinFET device 100, such as a cell. The dielectric material for the dielectric gate 122 and the gate end dielectric 124 may include silicon oxide, silicon nitride, silicon carbide, silicon oxynitride, silicon oxy-carbide, silicon carbide nitride, silicon oxy-carbide nitride, aluminum oxide, aluminum oxynitride, aluminum nitride, zirconium oxide, zirconium aluminum oxynitride, aluminum nitride, amorphous silicon, or a combination thereof.

In some embodiments, to prevent the metal layer 111 from being etched or oxidized in later processes, a gate dielectric cap layer 120 may be formed over the gate structure 110, including over the top surfaces of the second spacer 116, the gate dielectric layer 114, and the metal layer 111. The gate dielectric cap layer 120 may be formed of a dielectric material such as silicon oxide, silicon nitride, silicon carbide, silicon oxynitride, silicon oxy-carbide, silicon carbonitride, silicon oxy-carbonitride, or a combination thereof. The gate dielectric cap layer 120 may be formed using CVD, ALD, plasma-enhanced CVD (PECVD), plasma-enhanced-ALD (PEALD), or other suitable technique. In the embodiments represented in FIGS. 2a and 2b, the gate dielectric cap layer 120 is formed after the gate structure 110 replaces the dummy gate structure and the top surface of the workpiece 10 is planarized using a suitable technique, such as CMP.

Still referring to FIGS. 1, 2a and 2b, the FinFET device 100 may also include one or more contact structures and interconnect structures to electrically connect the FinFET device 100 to other FinFET devices or passive devices, such as capacitors, inductors and antenna structures in other part of the workpiece 10. For example, the FinFET device 100 may include source/drain contact 118 electrically coupled to the source/drain feature 109, source/drain contact via 129 electrically coupled to the source/drain contact 118, gate contact via 128 electrically coupled to a gate structure 110, and metal lines 130 electrically coupled to the gate contact vias 128 and the source/drain contact vias 129. These contact structures and interconnect structures are formed in or through one or more interlayer dielectric (ILD) layers, such as the first ILD layer 126 and the second ILD layer 132. In the embodiments represented in FIGS. 2a and 2b, the gate contact via 128 is disposed within the first ILD 126, the source/drain contact via 129 is disposed within the first ILD 126, and the metal line 130 is disposed in the second ILD layer 132.

Referring to FIGS. 2a and 2b, the first spacer 112 has a first thickness T1 along the X direction and the second spacer 116 has a second thickness T2 along the X direction. In some embodiments, T1 is smaller than T2 to make more space for formation of the source/drain feature 109 while T2 is greater than T1 to prevent bridging between source/drain contact 118 and the gate structure 110. Sufficient space may be crucial to formation of source/drain features 109. In n-type devices, multiple epitaxial layers with gradually increasing n-type doping concentrations may be formed to lower source/drain contact resistance and formation of the multiple epitaxial layers requires space made available by thin first thickness T1 of the first spacer 112. In p-type devices, space is needed to accumulate sufficient built-in strain in the strained silicon-germanium epitaxial feature. In some implementations, the ratio of the second thickness T2 to the first thickness T1 (T2/T1) is between about 1.05 and about 1.5. The first and second spacers 112 and 116 may be formed of silicon oxide, silicon oxynitride (SiON), silicon oxycarbide (SiOC), and silicon oxycarbonitride (SiOCN). In some embodiments, the first spacer 112 and the second spacer 116 have different compositions to have different properties. In some implementations, the second spacer 116 includes a first dielectric constant (k1) that is greater than a second dielectric constant (k2) of the first spacer 112. In these implementations, the first and second spacers 112 and 116 includes silicon oxycarbonitride or silicon carbonitride and the second spacer 116 has a higher carbon concentration than the first spacer 112. In some embodiments, the first spacer 112 includes a first height H1 along the Z direction and the second spacer 116 includes a second height H2 along the Z direction. In some instances, the first height H1 substantially corresponds to the height of the source/drain feature 109, which is between 30 nm and about 70 nm, such that the smaller thickness T1 allows more space for the source/drain feature 109. The second height H2 substantially correspond to the fin-top height of the gate structure 110 (the part of the gate structure 110 that rises above the fin 108), which is between about 6 nm and about 30 nm.

In some embodiments, the second spacer 116 may include more than one dielectric layer. In some implementations, the second spacer 116 may include a sandwich structure including a low-k dielectric layer sandwiched between two high-k dielectric layers. As used herein, the low-k dielectric layer has a dielectric constant smaller than 4 and the high-k dielectric layer has a dielectric constant greater than 4. In some instances, the low-k dielectric layer sandwiched between two high-k dielectric layers may be an air gap 117. In these instances, a tri-layer, which consists a middle layer of a first material sandwiched between two outside layers of a second material, is deposited over the dummy gate structure (or gate structure 110) and the middle layer is exposed by a planarization/recess process, followed by selective removal of the middle layer. In one example, the tri-layer may include a polysilicon layer sandwiched between two silicon oxide layers. In another example, the tri-layer may include a silicon nitride layer sandwiched between two silicon oxide layers. To seal the air gap 117 formed from the removal of the middle layer, a seal layer may be formed over the opening. In some instances, no seal layer is formed and the air gap may be sealed by an ILD layer. In some embodiments, the gate dielectric cap layer 120 may serve as the seal layer to seal off the air gap 117. The use of air gaps and other low-k dielectric layers reduce the parasitic capacitance between the source/drain contact 118 and the gate structure 110. In some embodiments, the second spacer 116 includes the air gap 117 and the first spacer 112 is free of any air gap. It is noted that while the air gap 117 is only illustrated in the embodiment in FIGS. 2a and 2b, air gaps may also be implemented in embodiments illustrated in FIGS. 3a, 3b, 4a, 4b, 5a, and 5b.

Figure 3A:
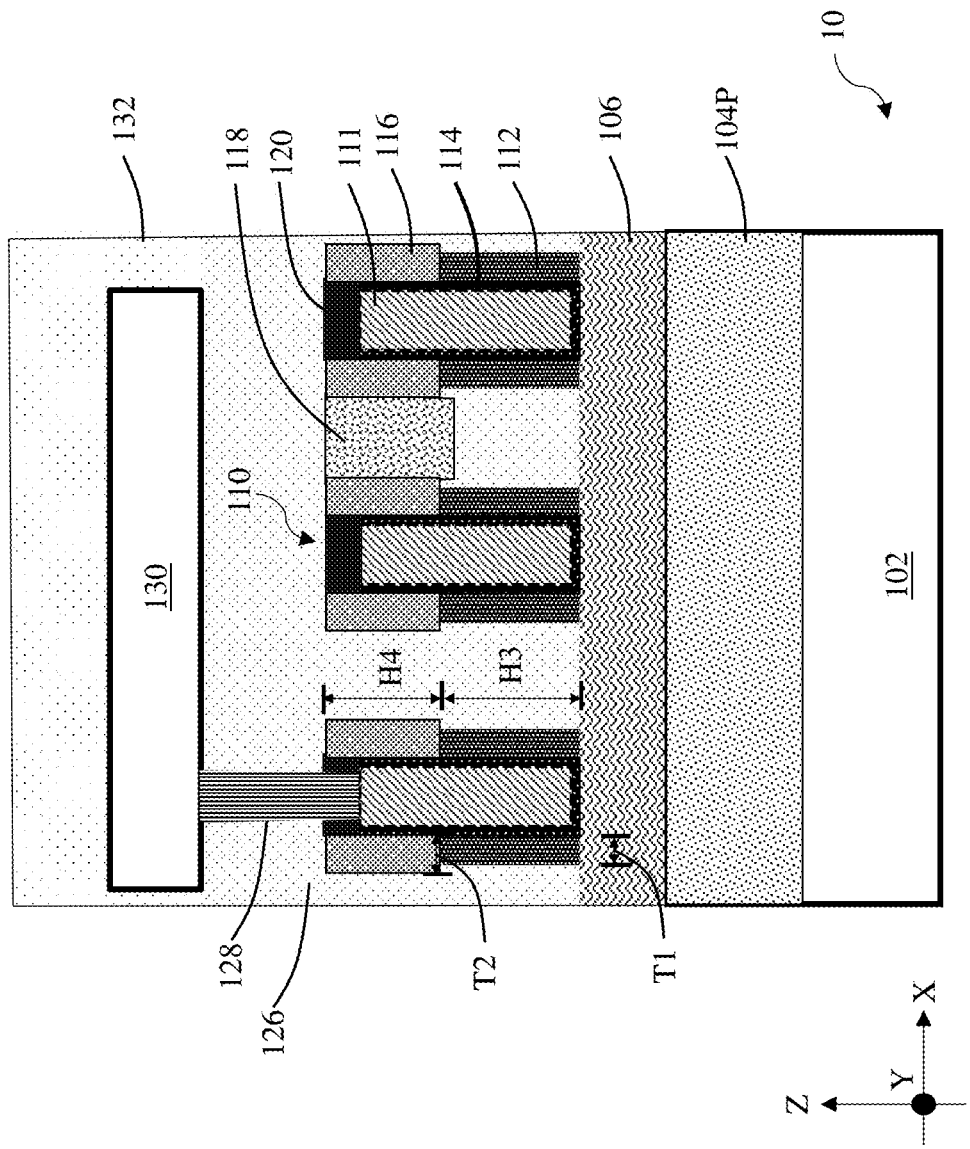
Figure 3B:
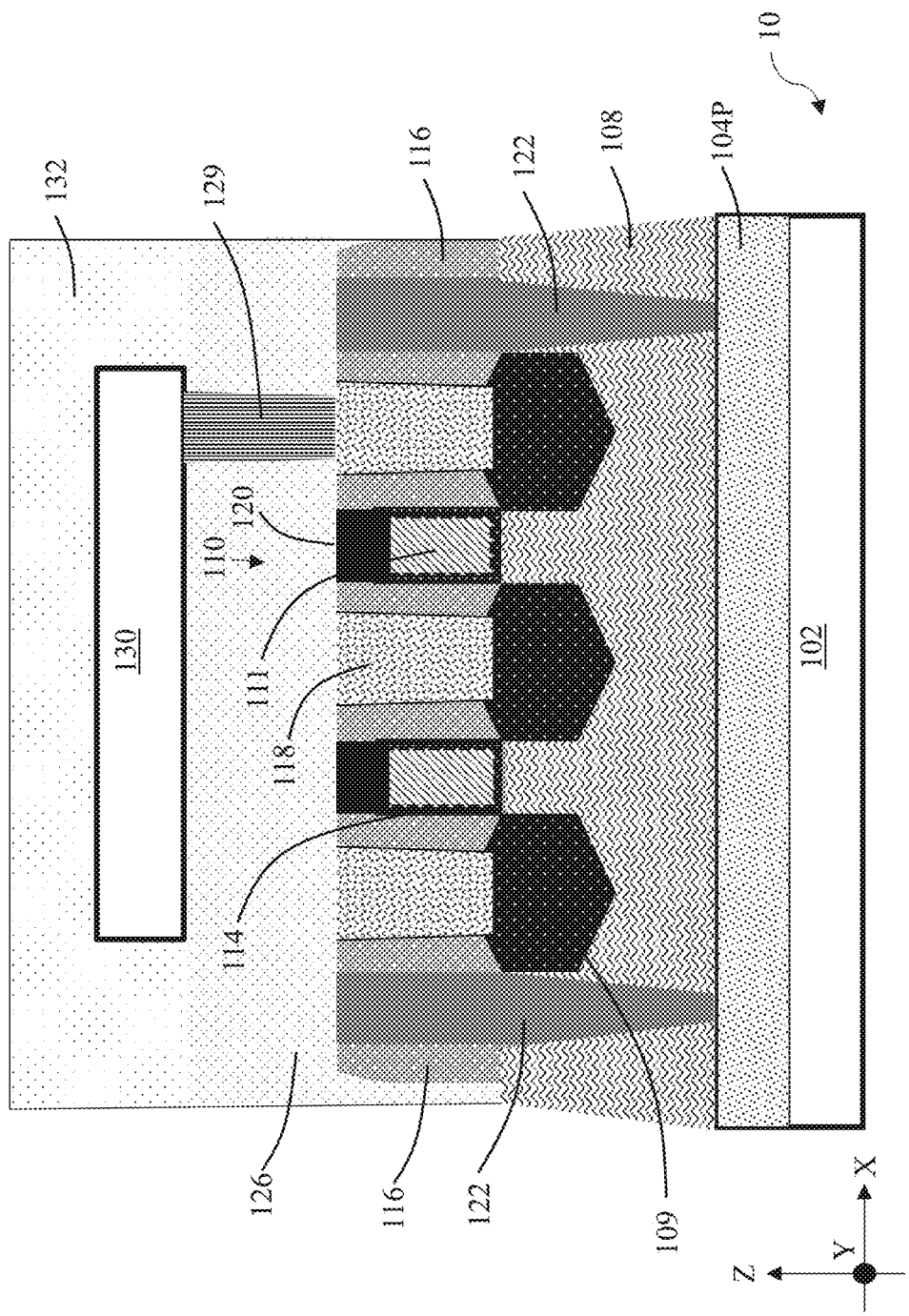

Referring now to FIGS. 3a and 3b, in some alternative embodiments, the gate dielectric cap layer 120 is formed over the gate structure 110, including over the gate dielectric layer 114 and the metal layer 111, between second spacers 116. In some instances, the gate dielectric cap layer 120 in FIGS. 3a and 3b may be referred to as a first self-aligned contact (SAC) dielectric layer 120. In those alternative embodiments, after the second spacers 116 are formed and the dummy gate structure is replaced with the gate structure 110, the gate structure 110, including the gate dielectric layer 114 and the metal layer 111, is selectively recessed to form a recess while the second spacer 116 is substantially unetched. Thereafter the gate dielectric cap layer 120 is deposited over the workpiece 10, including within the recess. The gate dielectric cap layer 120 may be formed of similar materials using similar processes as described above with respect to the embodiment illustrated in FIGS. 2a and 2b. After the excess material on the top surface is removed by a suitable planarization process, such as CMP, the gate dielectric cap layer 120 shown in FIG. 3b is formed.

Referring still to FIGS. 3a and 3b, in some embodiments, the first spacer 112 has the first thickness T1 along the X direction and the second spacer 116 has the second thickness T2 along the X direction. In some embodiments, T1 is smaller than T2 to make more space for formation of the source/drain feature 109 while T2 is greater than T1 to prevent bridging between source/drain contact 118 and the gate structure 110. In some implementations, the ratio of the second thickness T2 to the first thickness T1 (T2/T1) is between about 1.05 and about 1.5. In these embodiments, the first spacer 112 includes a third height H3 along the Z direction and the second spacer 116 includes a fourth height H4 along the Z direction. In some instances, the third height H3 substantially corresponds to the height of the source/drain feature 109 such that the smaller thickness T1 allows more space for the source/drain feature 109. The fourth height H4 substantially corresponds to the height of the source/drain contact 118 along the Z direction. The height of the source/drain feature 109 may be between about 30 nm and about 70 nm. The height of the source/drain contact 118 may be between about 10 nm and about 50 nm.

Figure 4A:
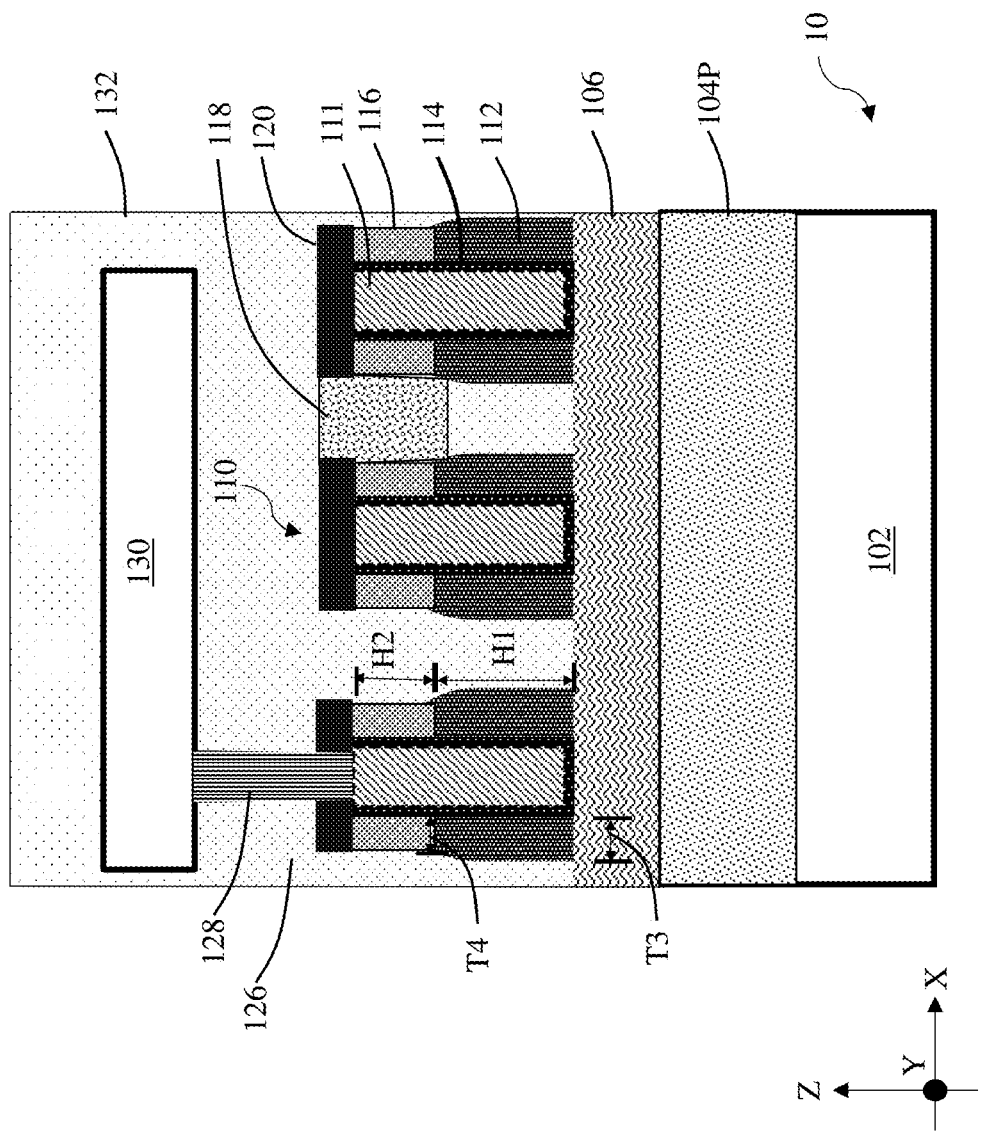
Figure 4B:
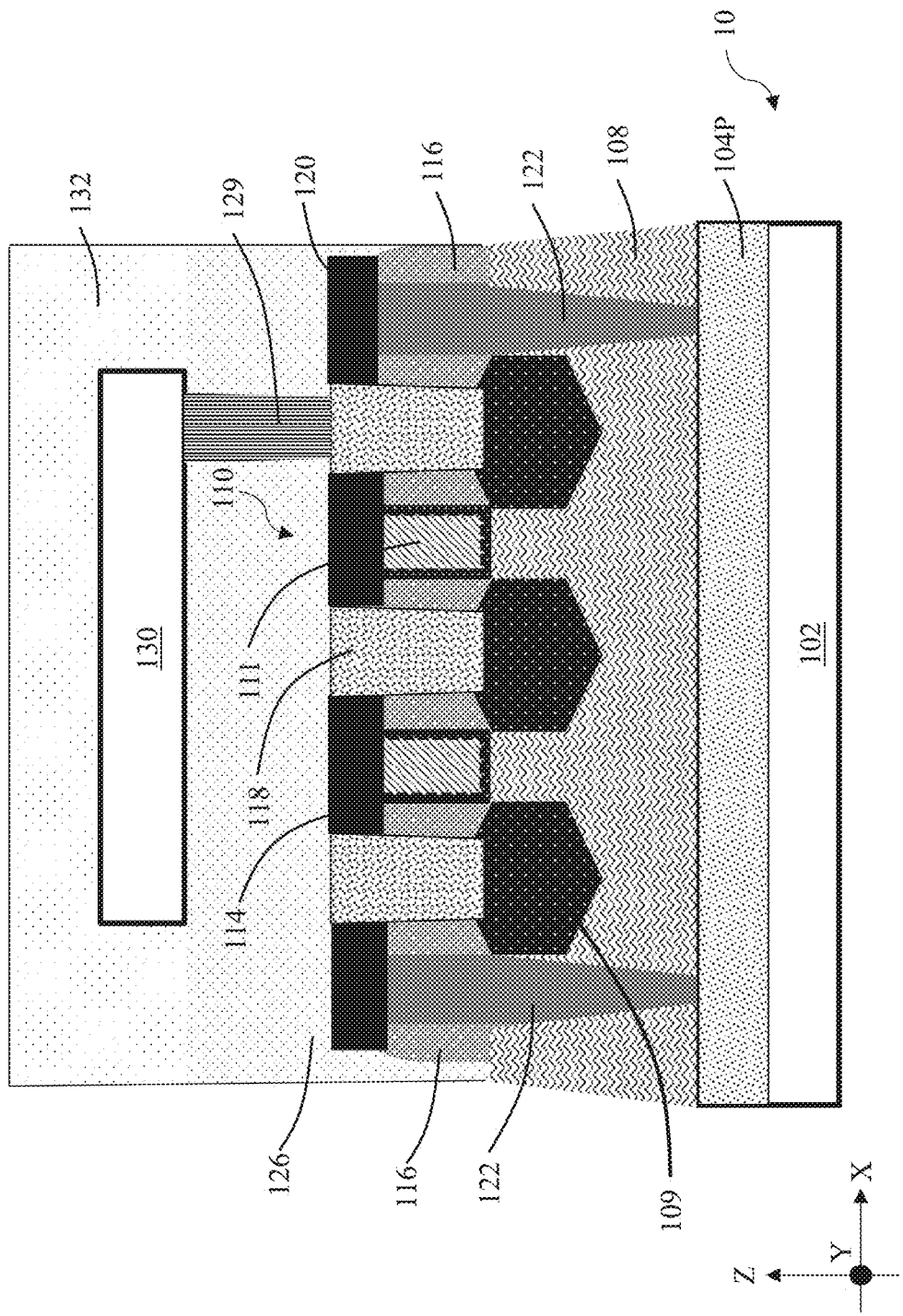

Referring now to FIGS. 4a and 4b, in some alternative embodiments, the gate dielectric cap layer 120 is formed over the top surfaces of the second spacer 116, the gate dielectric layer 114, and the metal layer 111, as in the embodiment shown in FIGS. 2a and 2b. The gate dielectric cap layer 120 may be formed with similar materials using similar methods, which will not be repeated here for brevity. In the embodiment represented in FIGS. 4a and 4b, the first spacer 112 has the third thickness T3 along the X direction and the second spacer 116 has the fourth thickness T4 along the X direction. In some embodiments, T4 is smaller than T3 to enlarge the landing area of the source/drain contact 118 and T3 is greater than T4 to ensure integrity and reliability of the isolation between the gate structure 110 and the source/drain feature 109. In some implementations, the ratio of the third thickness T3 to the fourth thickness T4 (T3/T4) is between about 1.05 and about 1.5. In these embodiments, the first spacer 112 includes the first height H1 along the Z direction and the second spacer 116 includes the second height H2 along the Z direction. In some instances, the first height H1 substantially corresponds to the height of the source/drain feature 109 and is between about 30 nm and about 70 nm. The second height H2 substantially corresponds to the fin-top height of the gate structure 110 and is between about 5 nm and about 30 nm.

Figure 5A:
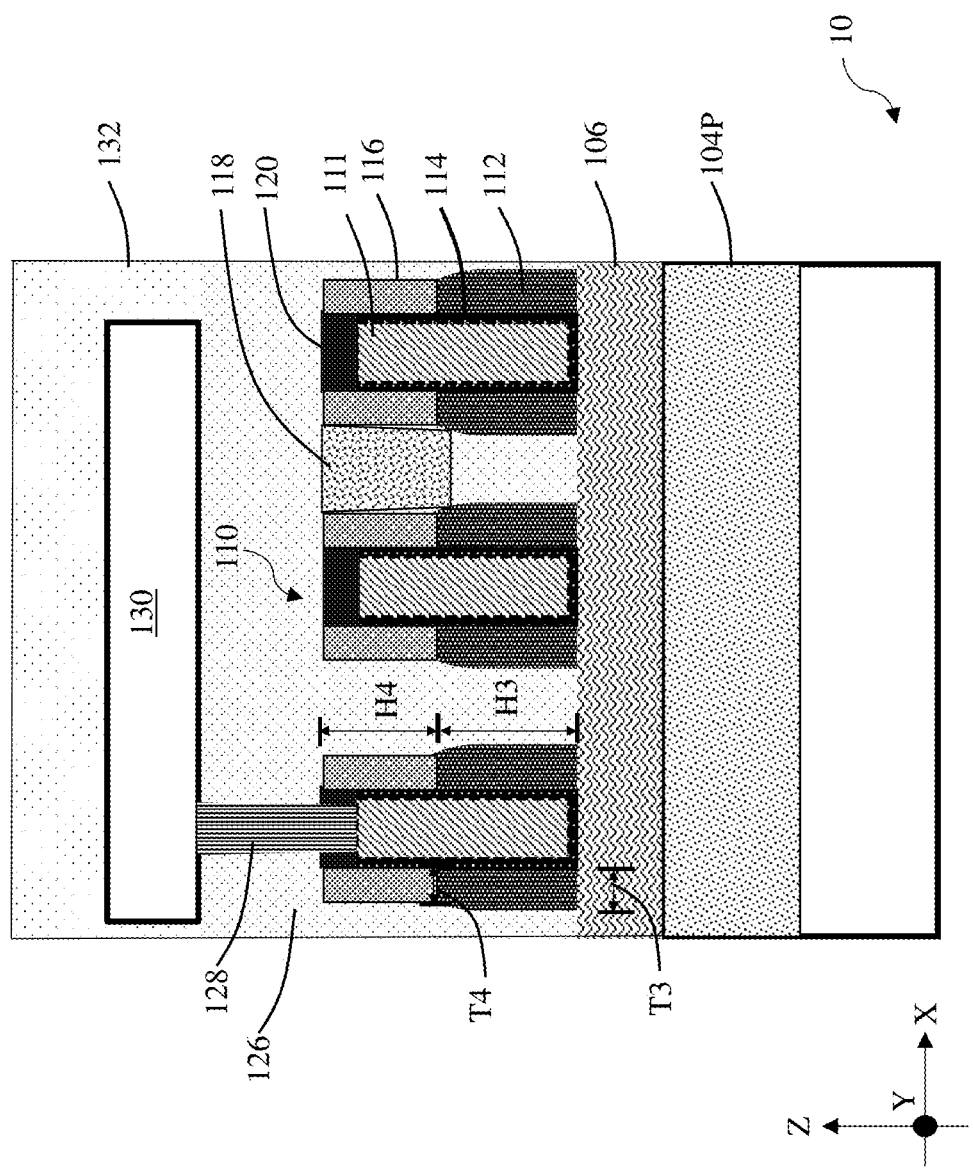
Figure 5B:
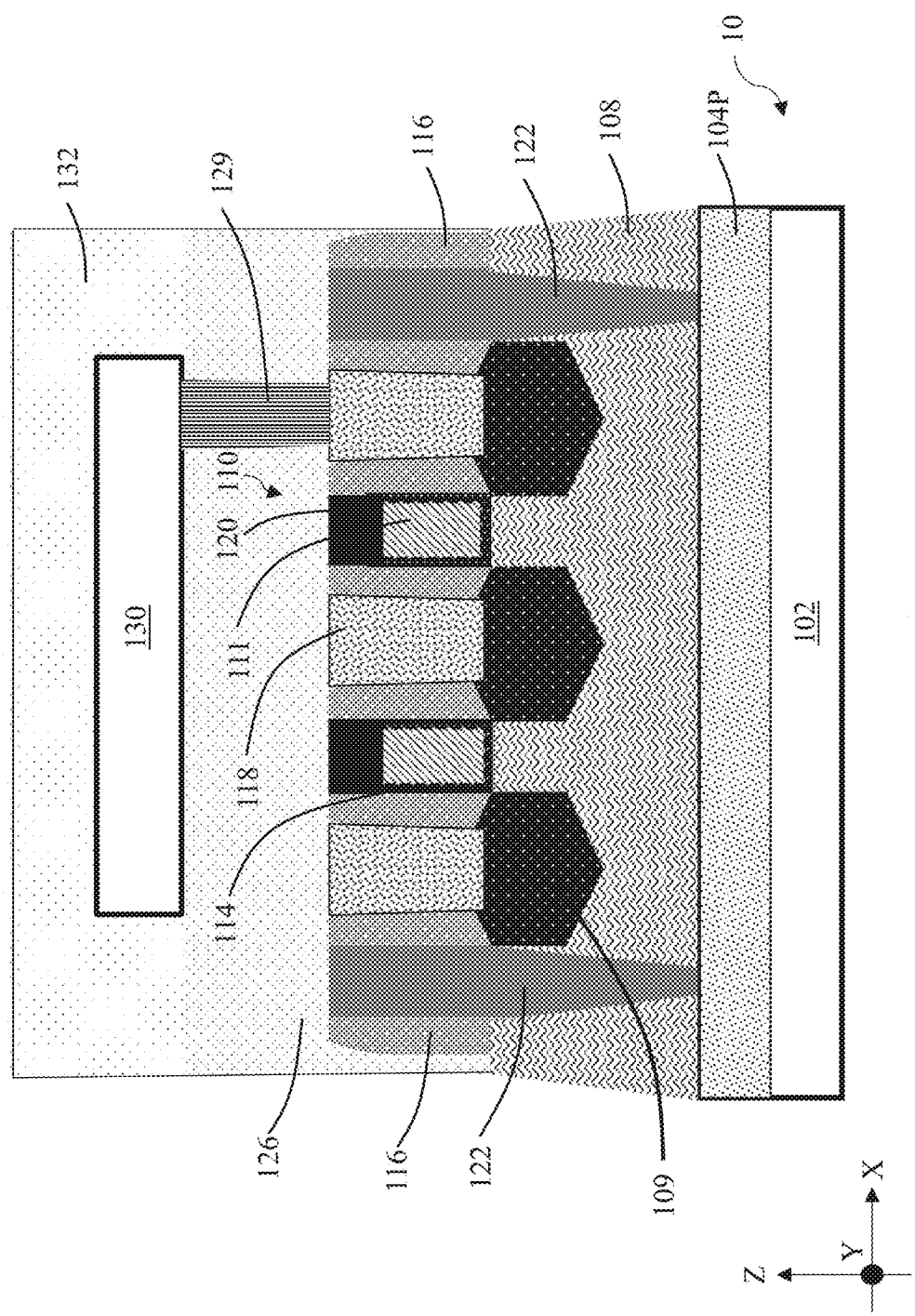

In the embodiment represented in FIGS. 5a and 5b, the gate dielectric cap layer 120 is formed over the gate structure 110, including over the gate dielectric layer 114 and the metal layer 111, between second spacers 116. In some instances, the gate dielectric cap layer 120 in FIGS. 5a and 5b may be referred to as a first self-aligned contact (SAC) dielectric layer 120. In those embodiments, the first spacer 112 has the third thickness T3 along the X direction and the second spacer 116 has the fourth thickness T4 along the X direction. In some embodiments, T4 is smaller than T3 to enlarge the landing area of the source/drain contact 118 and T3 is greater than T4 to ensure integrity and reliability of the isolation between the gate structure 110 and the source/drain feature 109. In some implementations, the ratio of the third thickness T3 to the fourth thickness T4 (T3/T4) is between about 1.05 and about 1.5. In these embodiments, the first spacer 112 includes a third height H3 along the Z direction and the second spacer 116 includes a fourth height H4 along the Z direction. In some instances, the third height H3 substantially corresponds to the height of the source/drain feature 109 such that the greater thickness T3 ensures integrity and reliability of the isolation between the gate structure 110 and the source/drain feature 109. The fourth height H4 substantially corresponds to the height of the source/drain contact 118 along the Z direction such that the smaller thickness T4 allows more room to form a larger source/drain contact 118 for improved connection and enlarged landing area. In some embodiments, the height of the source/drain feature 109 is between about 30 nm and about 70 nm. The height of the source/drain contact 118 is between about 10 nm and about 50 nm.

In embodiments illustrated in FIGS. 5a and 5b, the second spacer 116 is in contact with the source/drain contact 118. In alternative embodiments where the source/drain contact 118 is lined by a barrier layer to block oxygen diffusion from the second spacer 116, the second spacer 116 is in contact with the barrier layer, instead of the metal fill material of the source/drain contact 118. In some implementations, the barrier layer includes metal nitride, such as titanium nitride, tantalum nitride, tungsten nitride, cobalt nitride, or the like.

Figure 6:
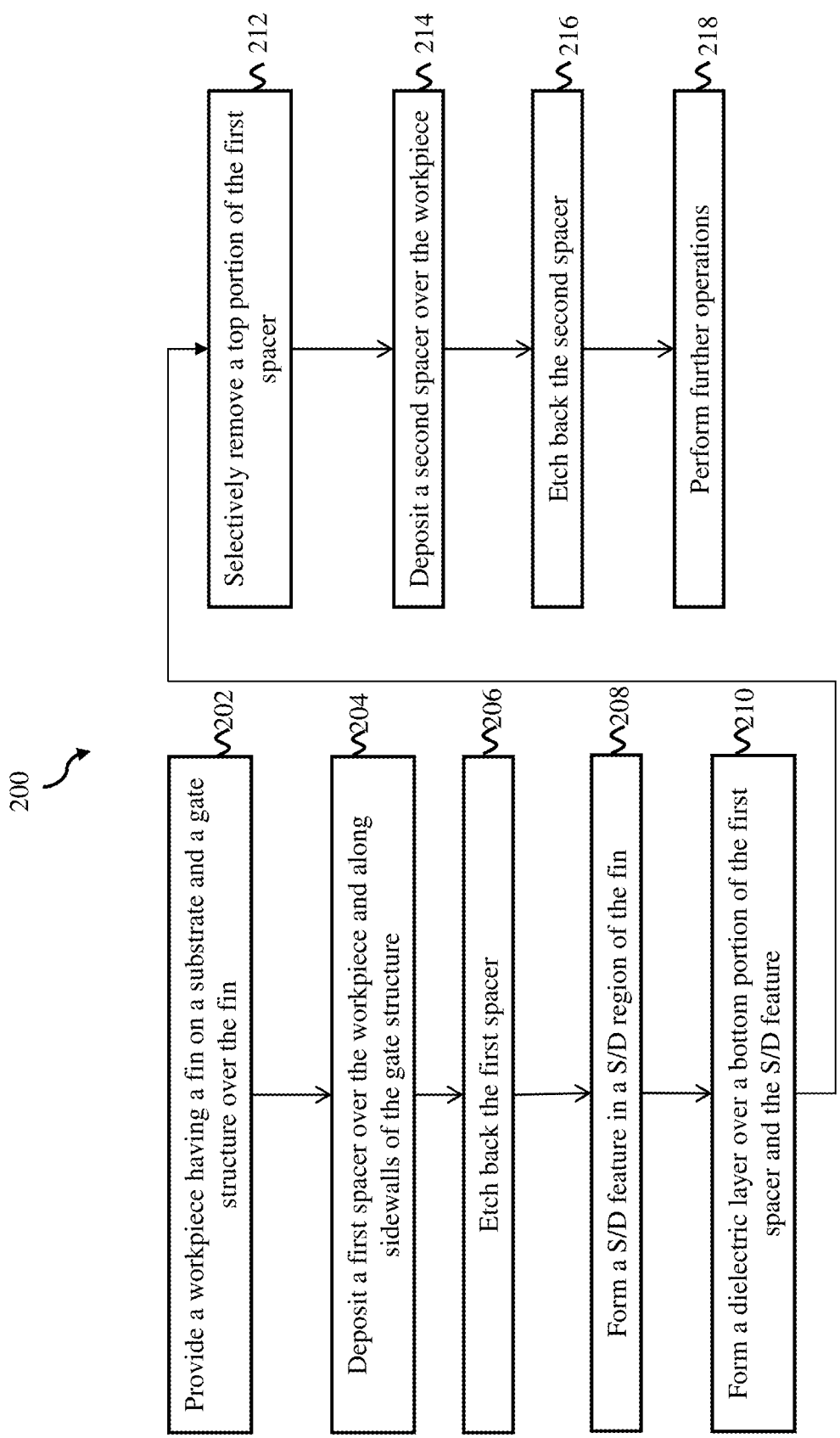
FIG. 6 is a flow chart of a method of fabricating a semiconductor device including stacked gate spacers, in accordance with some embodiments of the present disclosure.

FIG. 6 illustrates a method 200 of fabricating a semiconductor device, such as the FinFET device 100, according to embodiments of the present disclosure. The method 200 is merely an example and is not intended to limit the present disclosure beyond what is explicitly recited in the claims. Additional operations may be performed before, during, and after the method 200, and some operations described can be replaced, eliminated, or moved around for additional embodiments of the method 200.

The method 200 includes blocks 202, 204, 206, 208, 210, 212, 214, 216, and 218. At block 202, a workpiece is provided and the workpiece includes a fin on a substrate and a gate structure over the fin. It is noted that the gate structure at this stage may be a dummy gate structure, instead of a functional/final gate structure, when the gate replacement process is used. At block 204, a first spacer is deposited over the workpiece and along sidewalls of the gate structure. At block 206, the first spacer is etched back or recessed to expose a source/drain region of the fin. At block 208, a source/drain feature is formed in the source/drain region of the fin. At block 210, a dielectric layer is formed over the source/drain feature and a lower portion of the first spacer. For example, a dielectric material is deposited over the workpiece and is then etched back to form a dielectric layer that covers the lower portion of the first spacer but exposes an upper portion of the first spacer that is above the lower portion of the first spacer. At block 212, a upper portion of the first spacer, which is exposed in the dielectric layer, is selectively removed. At block 214, a second spacer is deposited over the gate structure and the first spacer. At block 216, the second spacer is etched back or recessed such that the second spacer over the gate structure and the source/drain feature is removed. At block 218, further operations are performed.

Some aspects of the method 200 are described below with references to FIGS. 1, 2a and 2b. In some embodiments, the first spacer 112 is first deposited over sidewalls of the gate structure 110 (or the dummy gate to be replaced by the gate structure 110) over the entire height of the gate structure 110 (or the dummy gate to be replaced by the gate structure 110) at block 204. The first spacer 112 may then be etched back/recessed/pulled back by a suitable etching technique, such as dry etching, at block 206. At block 206, the first spacer 112 deposited on top facing surfaces, such as the top surfaces of the isolation regions 106 between the gate structures 110, is removed at block 206 but the first spacer 112 deposited on sidewalls of the gate structure 110 remain in place to protect the gate structure 110 during the following source/drain recess operations at block 208. At block 208, the source/drain regions 1200 of the fin 108 is recessed and then source/drain features 109 are epitaxially grown over the recessed source/drain regions 1200 of the fin 108. In some embodiments, the source/drain features 109 of n-type FETs may include silicon that is in-site doped with an n-type dopant, such as arsenide or phosphorous and the source/drain features 109 of p-type FETs may include silicon and germanium that are in-site doped with a p-type dopant, such as boron. In some implementations, a contact etch stop layer (CESL) may be deposited over the source/drain features 109. The CESL may include semiconductor nitride that may or may not be doped with carbon.

At block 210, a dielectric layer is formed over a lower portion of the first spacer 112 and the source/drain feature 109. In some examples, a dielectric material similar to those forming the first ILD layer 126 or the second ILD layer 132 is deposited over the workpiece 100. The deposited dielectric material is then etched back to form a dielectric layer that covers a lower portion of the first spacer 112 but exposes an upper portion of the first spacer 112. The dielectric layer formed at block 210 functions as an etch mask for the removal of the upper portion of the first spacer 112.

At block 212, the upper portion of the first spacer 112, which is not covered by the dielectric layer formed at block 210, is selectively removed by a suitable etching technique, such as dry etch or wet etch. In some embodiments, the upper portion of the first spacer 112 that is removed at block 212 substantially corresponds to the height of the source/drain contact to be formed. The height of the source/drain contact may be between about 10 nm and about 50 nm. The lower portion of the first spacer 112 that remains upon conclusion of operations at block 212 substantially corresponds to the height of the source/drain feature 109, which may be between about 30 nm and 70 nm. In some implementations, after the source/drain feature 109 is formed at block 208 and the upper portion of the first spacer 112 is removed at block 212, the second spacer 116 is deposited over the workpiece 10 at block 214. In those implementations, the second spacer 116 is also deposited on the dielectric layer that covers the lower portion of the first spacer 112. At block 216, the second spacer 116 is recessed/etched back such that the second spacer 116 deposited on top surfaces of the gate structures 110 and the dielectric layer is removed. In some instances, the dielectric layer that covers the lower portion of the first spacer 112 may be removed before further processes commence. In other instances, the dielectric layer may stay in place to become a part of the first ILD layer 126.

In one aspect, as shown in the cross-sectional view along section X1-X1' in FIG. 2a, the first spacer 112 is disposed on and along a lower portion of sidewalls of the gate structure 110 where the gate structure 110 does not wrap around the fin 108. In another aspect, as shown in the cross-sectional view along section X2-X2' in FIG. 2b, only the second spacer 116 is present above the top surface of the fin 108 and the first spacer 112 is not present above the top surface of the fin 108. Also shown in FIG. 2b is that the second spacer 116 is disposed on a portion the source/drain feature 109, which is formed before the second spacer 116.

The further operations performed at block 218 may include formation of contact and interconnect structure to electrically couple the FinFET device 100 with other active or passive devices in the final device. The block 218 may include formation of the source/drain contact 118, which include recess of the source/drain feature 109, deposition of one or more barrier layer over the recessed source/drain feature 109, anneal of the barrier layer to form a metal silicide, deposition of a metal fill layer over the barrier layer to form the source/drain contact 118, and planarization of the top surface of the source/drain contact 118. The block 218 may include formation of source/drain contact via 129 and gate contact via 128, which includes deposition of the first ILD layer 126, formation of source/drain contact via holes and gate contact via holes through the first ILD layer 126 and the gate dielectric cap layer 120, deposition of a barrier layer in the contact via holes, deposition of a metal fill layer in the contact via holes, and planarization of the contact vias.

The block 218 may also include formation of the metal line 130, which includes, deposition of the second ILD layer 132, formation of a metal line trench, deposition of a barrier layer, and deposition of metal fill layer in the metal line trench. Depending on whether a barrier layer is formed, the second spacer 116 may be in direct contact with the metal fill layer in the source/drain contact 118 or the barrier layer of the source/drain contact 118.

Thus, the various embodiments described herein offer several advantages over the existing art. It will be understood that not all advantages have been necessarily discussed herein, no particular advantage is required for all embodiments, and other embodiments may offer different advantages. For example, a semiconductor structure according embodiments of the present disclosure includes a first spacer on sidewalls of a lower portion of the gate structure and a second spacer on sidewalls of an upper portion of the gate structure. The second spacer is stacked on top of the first spacer along a direction perpendicular to the substrate on which the semiconductor structure is disposed. The height of the first spacer corresponds to the height of the source/drain feature and the height of the second spacer corresponds to the height of the source/drain contact. This semiconductor structure allows the first and second spacers to have different thicknesses, different compositions, and different dielectric constants to meet different design needs, such as enlarging landing area, reducing parasitic capacitance, enlarging process tolerance, improving device reliability, allowing more space for formation of the source/drain features.

Therefore, one of the embodiments of the present disclosure provides a semiconductor device. The semiconductor device includes a fin extending from a substrate, a gate structure over the channel region, a first spacer extending along a sidewall of the lower portion of the gate structure, and a second spacer extending along a sidewall of the upper portion of the gate structure. The fin includes a channel region and a source/drain (S/D) region adjacent to the channel region. The gate structure includes an upper portion and a lower portion. The second spacer is disposed on a top surface of the first spacer. The first spacer is formed of a first dielectric material and the second spacer is formed of a second dielectric material different from the first dielectric material.

In some embodiments, the semiconductor device further includes a source/drain (S/D) feature over the source/drain (S/D) region. The second spacer is disposed over a portion of the source/drain (S/D) feature. In some implementations, the second spacer comprises an air gap and the first spacer is free of any air gap. In some instances, the first and second spacers are carbon doped. The first spacer includes a first carbon concentration and the second spacer includes a second carbon concentration greater than the first carbon concentration. In some embodiments, the first spacer includes a first dielectric constant and the second spacer includes a second dielectric constant greater than the first dielectric constant. In some implementations, the first spacer has a first thickness T1 measured from the gate structure and the second spacer has a second thickness T2 measured from the gate structure. The first thickness T1 is different from the second thickness T2. In some instances, a ratio of the second thickness T2 to the first thickness T1 (T2/T1) is between about 1.05 and about 1.5. In some other instances, a ratio of the first thickness T1 to the second thickness T2 (T1/T2) is between about 1.05 and about 1.5.

In another of the embodiments, a semiconductor device is provided. The semiconductor device includes a fin extending from a substrate, a gate structure over a channel region of the fin, a gate top dielectric layer over the gate structure, a first spacer extending along a sidewall of a lower portion of the gate structure, and a second spacer extending along a sidewall of an upper portion of the gate structure. The second spacer is stacked on a top surface of the first spacer. The second spacer is in contact with the gate top dielectric layer and the first spacer is spaced apart from the gate top dielectric layer.

In some embodiments, sidewalls of the gate top dielectric layer are in contact with the second spacer. In some embodiments, a top surface of the gate top dielectric layer are in contact with the second spacer. In some implementations, the semiconductor device further includes a source/drain (S/D) feature over a source/drain (S/D) region of the fin. The second spacer is disposed over a portion of the source/drain (S/D) feature. In some instances, the gate structure includes a gate dielectric layer and a gate electrode and the first and second spacers are in contact with the gate dielectric layer. In some embodiments, the semiconductor device further includes a source/drain (S/D) contact in electrical communication with a source/drain (S/D) feature over the source/drain (S/D) region. The source/drain contact includes a barrier layer and the barrier layer is in contact with the second spacer. In some implementations, the first and second spacers are carbon doped. The first spacer includes a first carbon concentration and the second spacer includes a second carbon concentration greater than the first carbon concentration. In some instances, the first spacer has a first dielectric constant and the second spacer has a second dielectric constant greater than the first dielectric constant. In some embodiments, the first spacer has a first thickness T1 measured from the gate structure and the second spacer has a second thickness T2 measured from the gate structure. The first thickness T1 is different from the second thickness T2.

In yet another of the embodiments, a method of forming a semiconductor device is provided. The method includes receiving a workpiece. The workpiece includes a substrate, a fin extending from the substrate, and a gate structure over a channel region of the fin. The method further includes forming a first spacer along sidewalls of the gate structure, removing an upper portion of the first spacer, forming a source/drain feature over a source/drain region of the fin, and forming a second spacer over the first spacer and a portion of the source/drain feature.

In some embodiments, the forming of the second spacer includes depositing a first dielectric layer over sidewalls of the gate structure, depositing a second dielectric layer over the first dielectric layer, depositing a third dielectric layer over the second dielectric layer, and removing the second dielectric layer to form an air gap. In some embodiments, the forming of the first spacer includes depositing a first dielectric layer, the forming of the second spacer includes depositing a second dielectric layer, and a carbon content of the second dielectric layer is greater than the carbon content of the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a fin extending from a substrate, the fin comprising a channel region and a source/drain (S/D) region adjacent to the channel region;
a source/drain (S/D) feature over the source/drain (S/D) region;
a gate structure over the channel region, the gate structure including an upper portion and a lower portion;
a first spacer extending along a sidewall of the lower portion of the gate structure; and
a second spacer extending along a sidewall of the upper portion of the gate structure,
wherein the second spacer is disposed on a top surface of the first spacer,
wherein an entirety of the first spacer is formed of a first dielectric material and an entirety of the second spacer is formed of a second dielectric material different from the first dielectric material,
wherein a distance between a bottom surface of the first spacer and the top surface of the first spacer is substantially equal to a height of the source/drain (S/D) feature.

2. The semiconductor device of claim 1,
wherein a portion of the second spacer is disposed over and in direct contact with a portion of the source/drain (S/D) feature.

3. The semiconductor device of claim 1, wherein the second spacer comprises an air gap and the first spacer is free of any air gap.

4. The semiconductor device of claim 1,
wherein the first and second spacers are carbon doped,
wherein the first spacer comprises a first carbon concentration and the second spacer comprises a second carbon concentration greater than the first carbon concentration.

5. The semiconductor device of claim 1,
wherein the first spacer comprises a first dielectric constant and the second spacer comprises a second dielectric constant greater than the first dielectric constant.

6. The semiconductor device of claim 1,
wherein the first spacer comprises a first thickness T1 measured from the gate structure and the second spacer comprises a second thickness T2 measured from the gate structure,
wherein the first thickness T1 is different from the second thickness T2.

7. The semiconductor device of claim 6, wherein the second thickness T2 is greater than the first thickness T1.

8. The semiconductor device of claim 1, further comprising:
a source/drain contact over and in contact with the source/drain feature,
wherein a height of the second spacer is substantially equal to a height of the source/drain (S/D) contact.

9. A semiconductor device, comprising:
a fin extending from a substrate, the fin comprising a channel region and a source/drain (S/D) region adjacent to the channel region;
a gate structure over the channel region, the gate structure including an upper portion and a lower portion;
a gate top dielectric layer over the gate structure;
a source/drain (S/D) feature over the source/drain (S/D) region;
a source/drain (S/D) contact over the source/drain (S/D) feature;
a first spacer extending along a sidewall of the lower portion of the gate structure; and
a second spacer extending along a sidewall of the upper portion of the gate structure,
wherein the second spacer is stacked on a top surface of the first spacer,
wherein an entirety of the first spacer is formed of a first dielectric material and an entirety of the second spacer is formed of a second dielectric material different from the first dielectric material,
wherein the second spacer comprises an air gap embedded in the second spacer and the first spacer is free of any air gap,
wherein the second spacer is in contact with the gate top dielectric layer and the first spacer is spaced apart from the gate top dielectric layer,
wherein a height of the second spacer is substantially equal to a height of the source/drain contact.

10. The semiconductor device of claim 9, sidewalls of the gate top dielectric layer are in contact with the second spacer.

11. The semiconductor device of claim 9,
wherein a portion of the second spacer is disposed over and in direct contact with a portion of the source/drain (S/D) feature.

12. The semiconductor device of claim 9,
wherein the gate structure includes a gate dielectric layer and a gate electrode,
wherein the first and second spacers are in contact with the gate dielectric layer.

13. The semiconductor device of claim 9, further comprising a source/drain (S/D) contact in electrical communication with the source/drain (S/D) feature,
wherein the source/drain contact includes a barrier layer,
wherein the barrier layer is in contact with the second spacer.

14. The semiconductor device of claim 9,
wherein the first and second spacers are carbon doped,
wherein the first spacer comprises a first carbon concentration and the second spacer comprises a second carbon concentration greater than the first carbon concentration.

15. The semiconductor device of claim 9,
wherein the first spacer comprises a first dielectric constant and the second spacer comprises a second dielectric constant greater than the first dielectric constant.

16. The semiconductor device of claim 9,
wherein the first spacer comprises a first thickness T1 measured from the gate structure and the second spacer comprises a second thickness T2 measured from the gate structure,
wherein the first thickness T1 is different from the second thickness T2.

17. A semiconductor structure, comprising:
a fin extending from a substrate;
a gate structure including an upper portion and a lower portion;
a dielectric gate including a first portion over the fin and a second portion extending into the fin;
a first spacer extending along a sidewall of the lower portion of the gate structure;
a second spacer extending along a sidewall of the upper portion of the gate structure; and
a third spacer extending along a sidewall of the first portion of the dielectric gate, wherein the second spacer is disposed on a top surface of the first spacer,
wherein the first spacer is formed of a first dielectric material and the second spacer is formed of a second dielectric material different from the first dielectric material, wherein the third spacer is formed of the second dielectric material.

18. The semiconductor structure of claim 17, further comprising:
a source/drain (S/D) feature; and
a source/drain (S/D) contact over and in contact with the source/drain feature,
wherein the upper portion is spaced apart from the source/drain (S/D) contact by the second spacer.

19. The semiconductor structure of claim 18,
wherein a height of the first spacer is substantially equal to a height of the source/drain (S/D) feature.

20. The semiconductor structure of claim 17, wherein a dielectric constant of the second spacer is smaller than a dielectric constant of the first spacer.

* * * * *